(12) United States Patent
Zanderighi et al.

(10) Patent No.: US 9,246,093 B2
(45) Date of Patent: Jan. 26, 2016

(54) PHASE CHANGE MEMORY CELL WITH SELF-ALIGNED VERTICAL HEATER AND LOW RESISTIVITY INTERFACE

(75) Inventors: Barbara Zanderighi, Milan (IT); Francesco Pipia, Milan (IT)

(73) Assignee: Micron Technology, Inc., Boise, ID (US)

( * ) Notice: Subject to any disclaimer, the term of this patent is extended or adjusted under 35 U.S.C. 154(b) by 743 days.

(21) Appl. No.: 12/496,503

(22) Filed: Jul. 1, 2009

(65) Prior Publication Data

US 2011/0001114 A1 Jan. 6, 2011

(51) Int. Cl.
| | |
|---|---|
| *H01L 47/00* | (2006.01) |
| *H01L 45/00* | (2006.01) |
| *H01L 27/24* | (2006.01) |
| *G11C 13/00* | (2006.01) |

(52) U.S. Cl.
CPC .......... *H01L 45/126* (2013.01); *H01L 27/2445* (2013.01); *H01L 27/2463* (2013.01); *H01L 27/2481* (2013.01); *H01L 45/06* (2013.01); *H01L 45/1233* (2013.01); *H01L 45/144* (2013.01); *H01L 45/1675* (2013.01); *G11C 13/0004* (2013.01); *G11C 2013/008* (2013.01)
USPC .............................................................. 257/5

(58) Field of Classification Search
None
See application file for complete search history.

(56) References Cited

U.S. PATENT DOCUMENTS

| | | | |
|---|---|---|---|
| 7,422,926 B2 | 9/2008 | Pellizzer et al. | |
| 7,888,166 B2* | 2/2011 | Sutardja | H01L 45/06 257/42 |
| 8,030,128 B1* | 10/2011 | Sutardja | H01L 27/2445 257/3 |
| 8,168,479 B2* | 5/2012 | Ha | 438/129 |
| 2004/0042329 A1 | 3/2004 | Dennison | |
| 2006/0138467 A1* | 6/2006 | Lung | 257/209 |
| 2006/0202245 A1 | 9/2006 | Zuliani et al. | |
| 2007/0148814 A1 | 6/2007 | Pellizzer et al. | |
| 2007/0254446 A1* | 11/2007 | Pellizzer et al. | 438/309 |
| 2007/0278470 A1 | 12/2007 | Pellizzer et al. | |
| 2008/0012079 A1* | 1/2008 | Zaidi | 257/379 |
| 2008/0099753 A1* | 5/2008 | Song et al. | 257/2 |
| 2008/0185570 A1* | 8/2008 | Wu et al. | 257/3 |

(Continued)

FOREIGN PATENT DOCUMENTS

| | | |
|---|---|---|
| CN | 1819295 A | 8/2006 |
| CN | 101393965 A | 3/2009 |

(Continued)

OTHER PUBLICATIONS

U.S. Appl. No. 12/481,496, "Phase Change Memory Cell With Self-Aligned Vertical Heater", filed Jun. 9, 2009, 26 pages.

(Continued)

*Primary Examiner* — Benjamin Sandvik
(74) *Attorney, Agent, or Firm* — Schwegman Lundberg & Woessner, P.A.

(57) ABSTRACT

A low resistivity interface material is provided between a self-aligned vertical heater element and a contact region of a selection device. A phase change chalcogenide material is deposited directly on the vertical heater element. In an embodiment, the vertical heater element in L-shaped, having a curved vertical wall along the wordline direction and a horizontal base. In an embodiment, the low resistivity interface material is deposited into a trench with a negative profile using a PVD technique. An upper surface of the low resistivity interface material may have a tapered bird-beak extension.

13 Claims, 8 Drawing Sheets

(56) References Cited

U.S. PATENT DOCUMENTS

2009/0017577 A1* 1/2009 An et al. .................. 438/102
2010/0308296 A1* 12/2010 Pirovano et al. ............ 257/5
2011/0001114 A1 1/2011 Zanderighi et al.

FOREIGN PATENT DOCUMENTS

TW 200834908 A 8/2008
TW 200849480 A 12/2008
TW 200849579 A 12/2008

OTHER PUBLICATIONS

"Chinese Application Serial No. 201010215301.8, Office Action mailed Nov. 5, 2013", 24 pgs.

"Taiwanese Application Serial No. 099121092, Office Action mailed Dec. 27, 2014", 10 pgs.

* cited by examiner

PHASE CHANGE MEMORY CELL WITH SELF-ALIGNED VERTICAL HEATER AND LOW RESISTIVITY INTERFACE

BACKGROUND

Embodiments of the invention relate to a process for manufacturing a phase change memory cell with fully self-aligned vertical heater elements.

Phase change memories are formed by memory cells connected at the intersections of bitlines and wordlines and comprising each a memory element and a selection element. A memory element comprises a phase change region made of a phase change material, i.e., a material that may be electrically switched between a generally amorphous and a generally crystalline state across the entire spectrum between completely amorphous and completely crystalline states.

Typical materials suitable for the phase change region of the memory elements include various chalcogenide elements. The state of the phase change materials is non-volatile, absent application of excess temperatures, such as those in excess of 150° C., for extended times. When the memory is set in either a crystalline, semi-crystalline, amorphous, or semi-amorphous state representing a resistance value, that value is retained until reprogrammed, even if power is removed.

Selection elements may be formed according to different technologies. For example, they can be implemented by diodes, metal oxide semiconductor (MOS) transistors or bipolar transistors. Heater elements are supplied in connection with the selection elements in order to provide heat to the chalcogenide elements.

DETAILED DESCRIPTION

Figure 1:
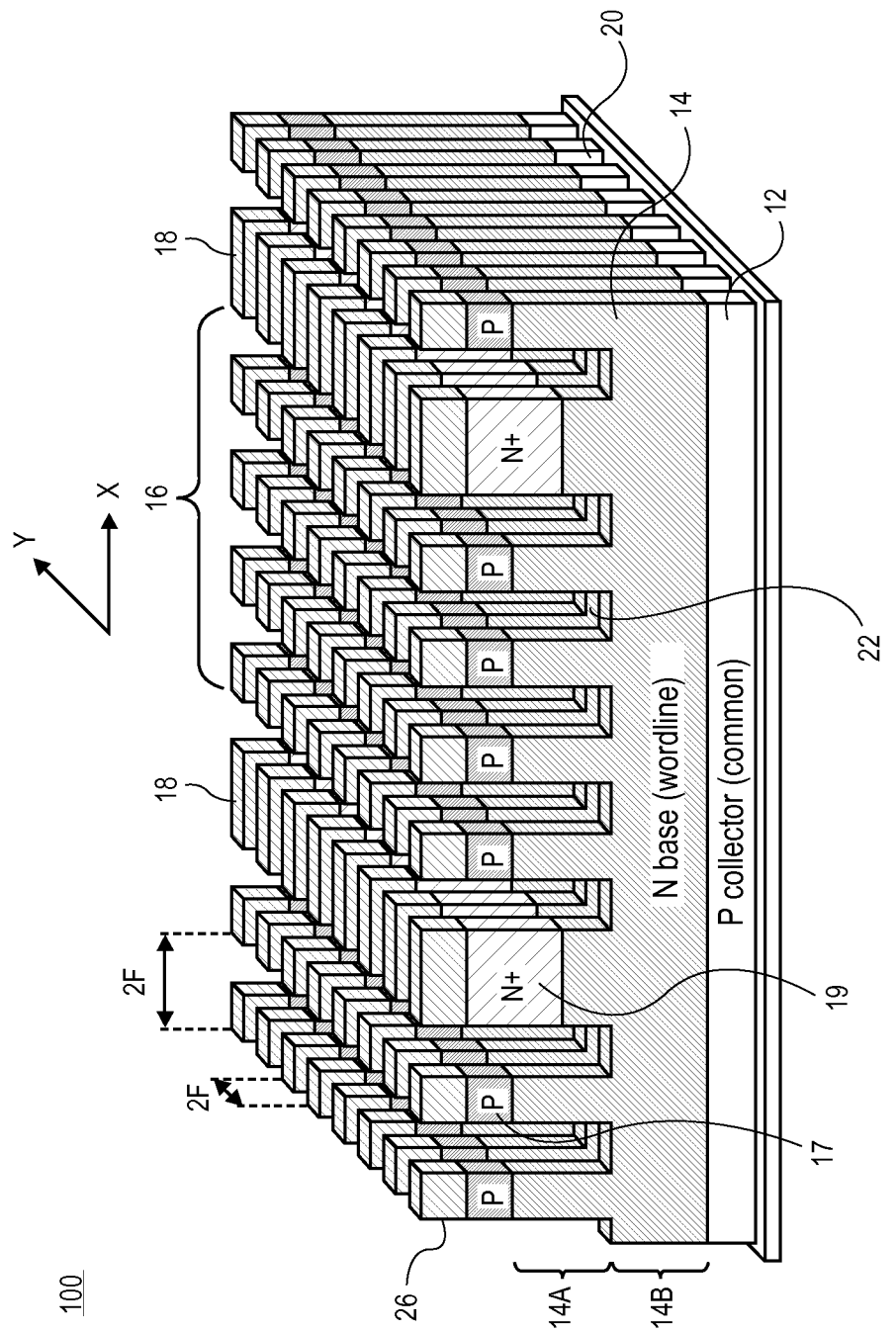
FIG. 1 is an isometric view of a pnp-BJT array in accordance with an embodiment.

Embodiments of the invention relate to a phase change memory cell with fully self-aligned vertical heater elements and process for manufacturing the same.

Various embodiments described herein are described with reference to figures. However, certain embodiments may be practiced without one or more of these specific details, or in combination with other known methods and configurations. Reference throughout this specification to "one embodiment" or "an embodiment" means that a particular feature, configuration, composition, or characteristic described in connection with the embodiment is included in at least one embodiment of the invention. Thus, the appearances of the phrase "in one embodiment" or "an embodiment" in various places throughout this specification are not necessarily referring to the same embodiment of the invention. Furthermore, the particular features, configurations, compositions, or characteristics may be combined in any suitable manner in one or more embodiments.

Embodiments of the invention disclose a phase change memory cell including a self-aligned vertical heater element deposited directly on a low resistivity interface layer which is deposited directly on a silicide contact region of a selection element. A phase change material is deposited directly on the vertical heater element. The low resistivity interface layer decreases the resistance at the interface between the silicide contact region of the selection element and the heater element, thereby reducing voltage requirements and improving the ability to read and write the phase change material. As used herein, the term low resistivity means having a resistivity lower than that of the material used to form the heater element.

In an embodiment, the selection element is a vertical pnp bipolar junction transistor (BJT) and the vertical heater element is L-shaped, having a curved vertical wall extending along the wordline direction and a horizontal base orthogonal to the curved vertical wall. The self-aligned fabrication process allows for controlled alignment of the curved vertical wall to the bitline direction of the phase change memory cell, as well as the controlled alignment between the phase change material and heater element. The curved vertical wall and the horizontal base may have the same thickness.

The L-shaped vertical heater element is formed by performing an anisotropic etching operation to form a trench in a dielectric layer, following by an isotropic etching operation to create a negative profile in the trench sidewalls. A low resistivity interface layer is deposited within the anisotropically etched trench utilizing a unidirectional deposition technique such that the low resistivity interface layer does not deposit on the negative profile. In an embodiment, the deposited low resistivity interface layer includes an upper tapered bird-beak extension where the low resistivity interface layer is deposited on the anisotropically etched trench sidewall. A conformal conductive layer is then deposited over the structure, which is subsequently processed to form the L-shaped vertical heater element having a curved vertical wall and a horizontal base.

In one embodiment, a pnp-BJT array includes emitter pillars having a width and depth of F×F, with F being the lithographic node. For example, utilizing 193 nm immersion lithography, the width and depth of the emitter pillars is approximately 50 nm. In such an embodiment, the L-shaped vertical heater element may have a thickness of between 5-10 nm and a height between 50-150 nm. In an embodiment, the curved vertical wall portion has an aspect ratio of at least 5:1 height:width, with the width being measured at the midpoint.

FIG. 1 is an isometric view of a pnp-BJT array 100 in accordance with an embodiment. As shown in FIG. 1, the array includes four columns of emitter pillars 16 shared by one column of base contact pillars 18. Each set of emitter columns 16 is separated by a column of a wider base contact column 18. Dielectrics that fill all the regions for isolation among the pillars are transparent in the illustration. A semiconductor substrate is doped with a p-type dopant to form the p-type collector (common) 12 under a shallower base dopant that forms an n-type wordline 14 including upper part 14a and lower part 14b.

Each row of emitter pillars 16 is separated from an adjacent row in the x-direction by shallow trench isolation 22. Likewise, each column of emitter pillars 16 is separated from adjacent emitter pillars 16 in the y-direction by shallow trench isolation 20. The shallow trench isolations 22 may be shallower than the shallow trench isolations 20. The deeper shallow trench isolations 20 may extend all the way into the p-type collector 12 while the shallow trench isolations 22 may extend only into the n-type wordline 14. Thus, the n-type wordline 14 is made up of a lower part 14b which is below the shallow trench isolations 22, and an upper part 14a which is above the bottom of shallow trench isolations 20.

The base contacts 18 are n+ base contacts, the emitters 16 are p-type, and the wordline is n-type. Silicide contact regions 26 are formed on top of p+ emitter regions 17 and n+ base regions 19. A BJT transistor is formed with an emitter 16, base contact 18, wordline 14, and collector 12. The wordline 14 is common to each row in the x-direction. The collector 12 is common to all the transistors. In certain embodiments, the polarities of the transistors may be reversed. In addition, the number of columns of emitters 16 between base contacts 18 can be more or less than four.

In an embodiment, each emitter pillar 16 has a width and depth of F×F, with F being the lithographic node. Emitters 16 are separated in the x-direction by shallow trench isolations 22 with a width of F, and in the y-direction by shallow trench isolations 20 with a width F. By way of example, the pnp-BJT array may be fabricated utilizing 193 nm immersion lithography, in which the width and depth of the pillars is approximately 50 nm, the height of the pillars along the x-direction is approximately 100 nm, and the height of the pillars along the y-direction is approximately 250 nm. The silicide 26 may comprise cobalt silicide, though other metal silicides may be used. Where dimensions of the pnp-BJT array are larger, titanium silicide may be preferred. Where dimensions of the pnp-BJT array are smaller, nickel silicide may be preferred. Though embodiments are not limited to such dimensions determined by the lithographic node F.

Figure 2:
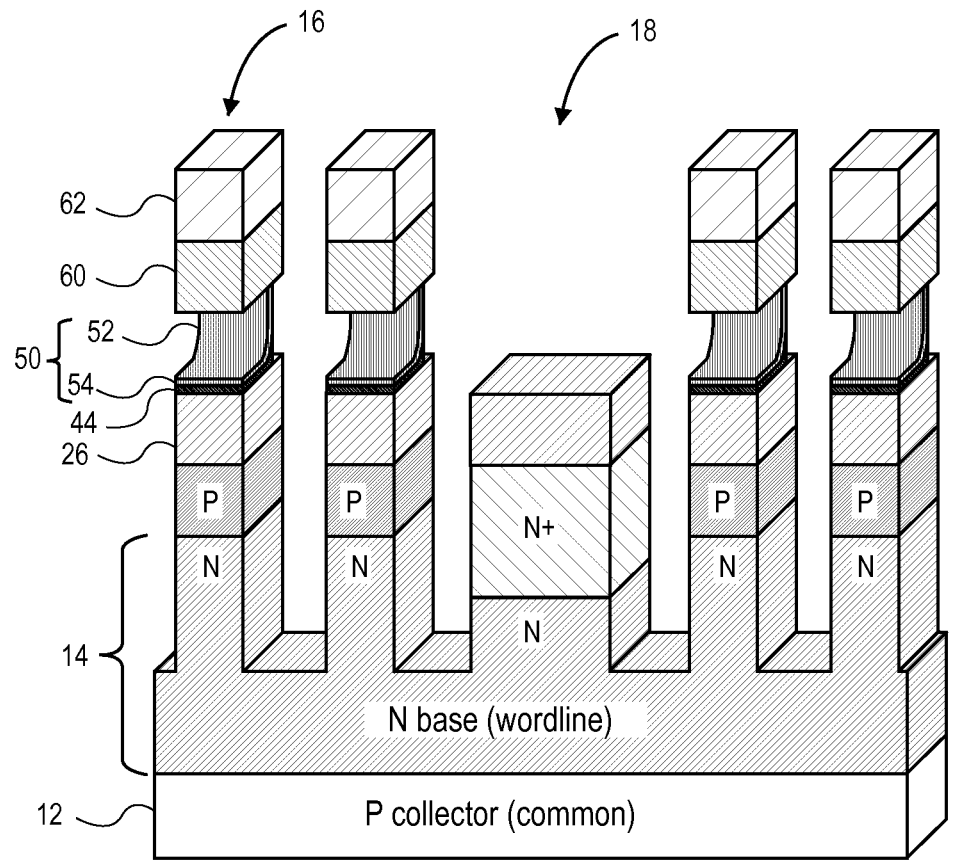
FIG. 2 is an isometric view of vertical heater elements disposed on a row of emitter pillars in the x-direction of the pnp-BJT array of FIG. 1.

FIG. 2 is an isometric view of L-shaped heater elements disposed on a row of emitter pillars in the x-direction of a pnp-BJT array. The L-shaped heater elements 50 have a curved vertical wall 52 of which a width extends along the wordline direction, and a horizontal base 54 orthogonal to the wordline direction. The horizontal base 54 is in direct contact with a low resistivity interface layer 44, which is in direct contact with the silicide contact region 26 on the emitter pillar 16. A phase change material 60, such as a chalcogenide, is in direct contact with the curved vertical wall 52 of the L-shaped heater element 50. A metallic cap 62 is formed on phase change material 60. As shown in FIG. 2, and as will become more apparent in the following figures, the phase change material 60 and L-shaped heater element 50 are self-aligned with the bitline direction of the phase change memory cell.

Figure 3:
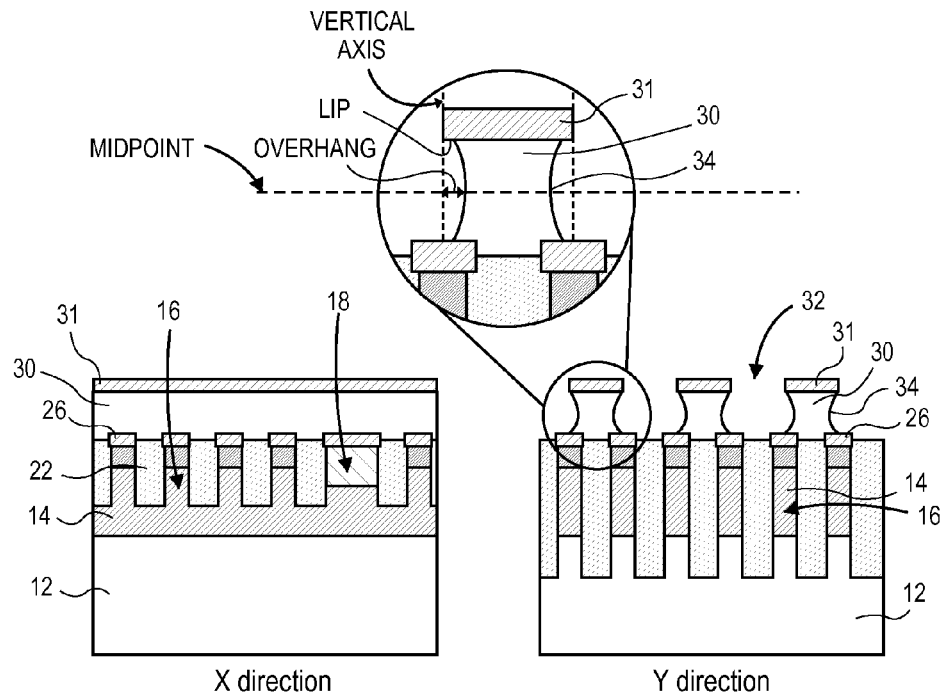
FIG. 3 is a cross-sectional illustration along the x-direction (parallel to the wordline direction) and the y-direction (parallel to the bitline direction) of trenches etched in a dielectric layer blanket deposited over the pnp-BJT array of FIG. 1.

FIG. 3 is a cross-sectional illustration along the x-direction (parallel to the wordline direction) and the y-direction (parallel to the bitline direction) of trenches formed in a dielectric layer blanket deposited over the pnp-BJT array of FIG. 1. In an embodiment, dielectric layers 30 and 31 are blanket deposited over the pnp-BJT array, patterned and anisotropically etched to form trenches 32. Trenches 32 are then isotropically etched to form sidewalls 34 with a negative profile in dielectric layer 30.

Dielectric layers 30 and 31 may be deposited utilizing conventional vapor deposition techniques such as chemical vapor deposition (CVD) to a thickness which is greater than the eventual height of the heater elements because some of the thickness will be removed in a subsequent planarization operation. In an embodiment, dielectric layers 30 and 31 are formed of two different materials in order to provide differential etch selectivities and indices of refraction for endpoint determination during chemical mechanical polishing (CMP). In an embodiment, dielectric layer 30 is a nitride, such as silicon nitride, between 50 and 200 nm thick, and dielectric layer 31 is an oxide, such as silicon oxide, between 20 and 100 nm thick, though other materials and thicknesses may be used.

Trenches 32 may be formed utilizing conventional lithographic techniques and anisotropic etching. This is followed by an isotropic etching operation. In an embodiment a wet buffered oxide etch utilizing known chemistries including fluorinated etchants (ex. HF) with buffers (ex. $NH_4F$) or solvents is used. In an embodiment, the isotropic etchant has an etch selectivity of at least 5:1 or 10:1 to dielectric layer 30 and dielectric layer 31.

The expanded view in FIG. 3 illustrates an exaggerated view of sidewalls 34 after the isotropic etching operation. As shown, sidewalls 34 in dielectric layer 30 have a negative profile from at least the midpoint section and above resulting in dielectric layer 30 having an hourglass shape. Due to the different etch selectivites to dielectric layers 30 and 31, the edge of layer 31 hangs over the respective sidewall 34, represented as the overhang in FIG. 3. In an embodiment, the entire sidewall surface 34 is etched so that a lip is formed underneath the bottom surface of layer 31 where layer 30 has been completely etched away, though embodiments do not necessarily require the formation of a lip. In an embodiment, the lip is between 0 and 20 nm and the overhang is at least 5 nm.

As described above, embodiments of the present invention describe a two layer dielectric system including layers 30 and 31 so that the different etch selectivities can be taken advantage of to create an overhang and/or lip in layer 30 while layer 31 preserves the physical quality of the top surface of layer 30 thereby producing a negative profile. It is to be appreciated that additional embodiments exist in which only a single dielectric layer 30 is utilized to create the negative profile, or more than two dielectric layers are utilized.

In an embodiment, trenches 32 are formed with curved sidewalls 34 approximately directly above the center vertical axis of the emitter pillars 16 (and base pillars 18 not shown) in order to facilitate placement of the curved vertical wall 52 of heater element 50 directly above the center vertical axis of the emitter pillars 16. In such an embodiment, trenches 32 then have a width of 2 F, or approximately 100 nm utilizing 193 nm immersion lithography. Though it is to be appreciated that such alignment is not required for the self-alignment process in accordance with embodiments of the invention. As will become more evident in the following figures, the width of trenches 32 can be wider or narrower in order to tailor both the placement of the curved vertical wall component 52 of the heater element 50 on the underlying silicide 26 of the emitter pillars 16. A wider trench 32 will result in a heater element 50 with a longer horizontal base component 54 and low resistivity interface layer 44, with a narrower trench 32 resulting in a heater element 50 with a shorter or non-existent horizontal base component 54 and low resistivity interface layer 44.

Figure 4:
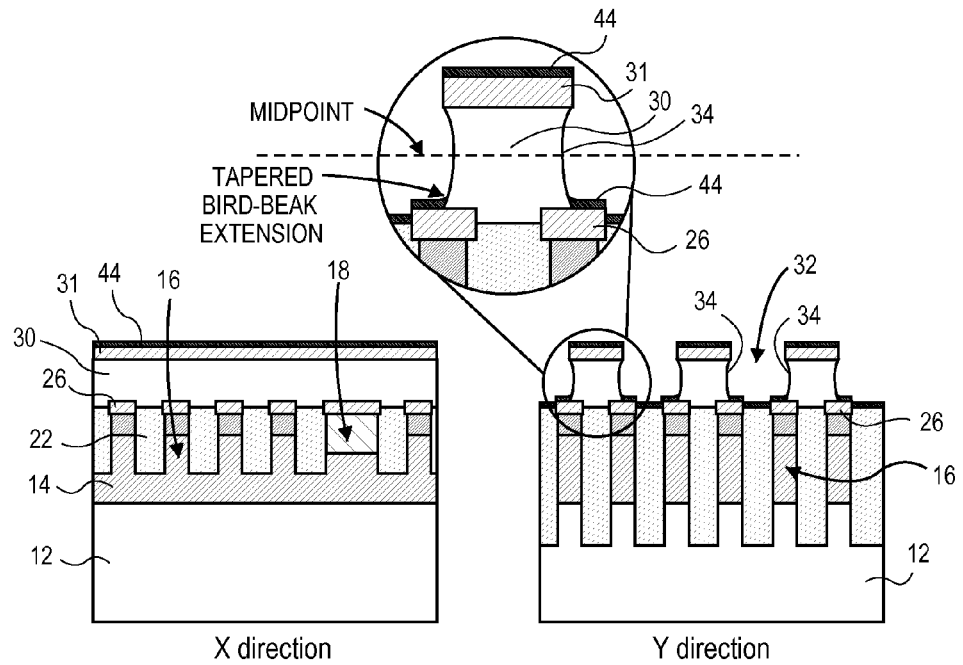
FIG. 4 is a cross-sectional illustration of a low resistivity interface layer deposited over the pnp-BJT array of FIG. 3.

As illustrated in FIG. 4, a low resistivity interface layer 44 is then deposited over the pnp-BJT array of FIG. 3. Low resistivity interface layer 44 provides a low resistance interface between the silicide contact region 26 of the selection device and the subsequently formed heating element 50. In an embodiment, low resistivity interface layer 44 is a metallic layer. Suitable metals include, but are not limited to, cobalt, titanium, tantalum, and tungsten. In an embodiment, low resistivity interface layer 44 may be a single layer, and alternatively can include multiple layers. The low resistivity interface layer 44 need only be thick enough to provide a conductive interface between the silicide contact region 26 and subsequently formed heater element 50, and need not be the size of a functional interconnect or via as is known in the art. In an embodiment, the thickness of low resistivity interface layer 44 deposited on an approximate horizontal surface of the silicide contact region 44 is is approximately 5 to 10 nm.

Low resistivity interface layer 44 is deposited utilizing a unidirectional deposition technique which does not deposit onto negative profiles. For example, low resistivity interface layer is deposited by a physical vapor deposition (PVD) technique such as sputtering. As shown in FIG. 4, low resistivity interface layer 44 is deposited with a uniform thickness on horizontal surfaces. Low resistivity interface layer 44 also is deposited on the exposed base region of curved sidewalls 34 and may form a tapered bird-beak extension at an uppermost portion. The tapered bird-beak extension may rise vertically up to at most the midpoint of the total height of dielectric layer 30. Unidirectional deposition techniques such as PVD do not deposit onto negative profiles, and therefore the tapered bird-beak extension does not rise above beyond the midpoint of the total height of dielectric layer 30. Accordingly, a PVD deposition technique is particularly useful for depositing low resistivity interface layer 44 only at the bottom or exposed base region of the sidewall 34 because even a small amount of low resistivity interface layer 44 on the sidewalls 34 can dramatically decrease the resistance of subsequently formed heater element 50.

Figure 5:
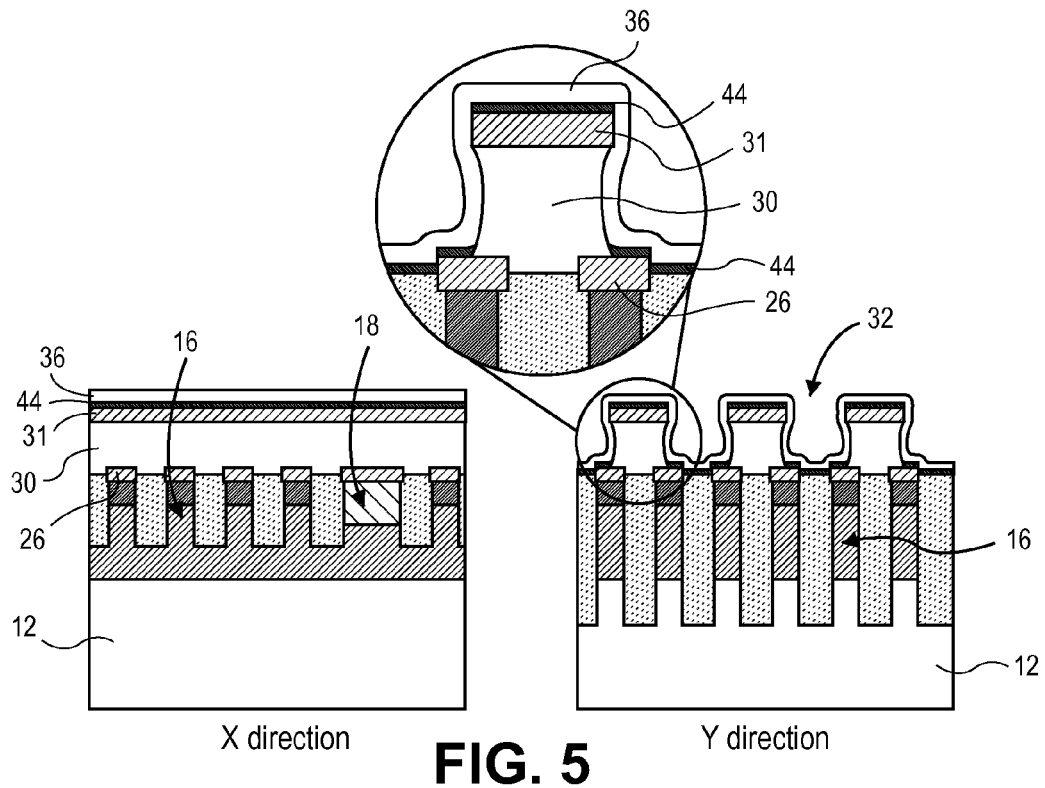
FIG. 5 is a cross-sectional illustration of a conformal conductive layer deposited over the pnp-BJT array of FIG. 4.

A conformal conductive layer 36, which is subsequently processed to form heater elements 50, is then deposited over the pnp-BJT array as illustrated in FIG. 5. Various conductive materials are available depending upon the electrical properties desired. In an embodiment, the conductive material may be a metal nitride (e.g., WN, TiN) or a metal nitride composite (e.g., WCN, TiAlN, TiSiN). Various conformal deposition techniques can be utilized such as chemical vapor deposition (CVD). Thickness of the conductive layer 36 is also dependent upon the electrical properties desired. In an embodiment, a metal nitride or metal nitride composite conformal conductive layer is between 3 and 15 nm thick on top of the low resistivity interface layer 44 and within the trenches 32. The conformal conductive layer does not entirely fill the trench 32. Placement of the curved vertical wall component 52 of heater element 50 is determined by both the thickness of the conformal conductive layer 36, as well as placement and width of the trench 32. Thus, the curved vertical portion of conductive layer 36 formed in the trench 32 will become the curved vertical wall component 52 of heater element 50. In an embodiment, the curved vertical wall component 52 (i.e. curved vertical portion of conductive layer 36) is directly above the center vertical axis of an underlying emitter pillar 16. In such an embodiment, the horizontal base component 54 may have a length of approximately half of the width of the underlying emitter pillar 16.

Figure 6:
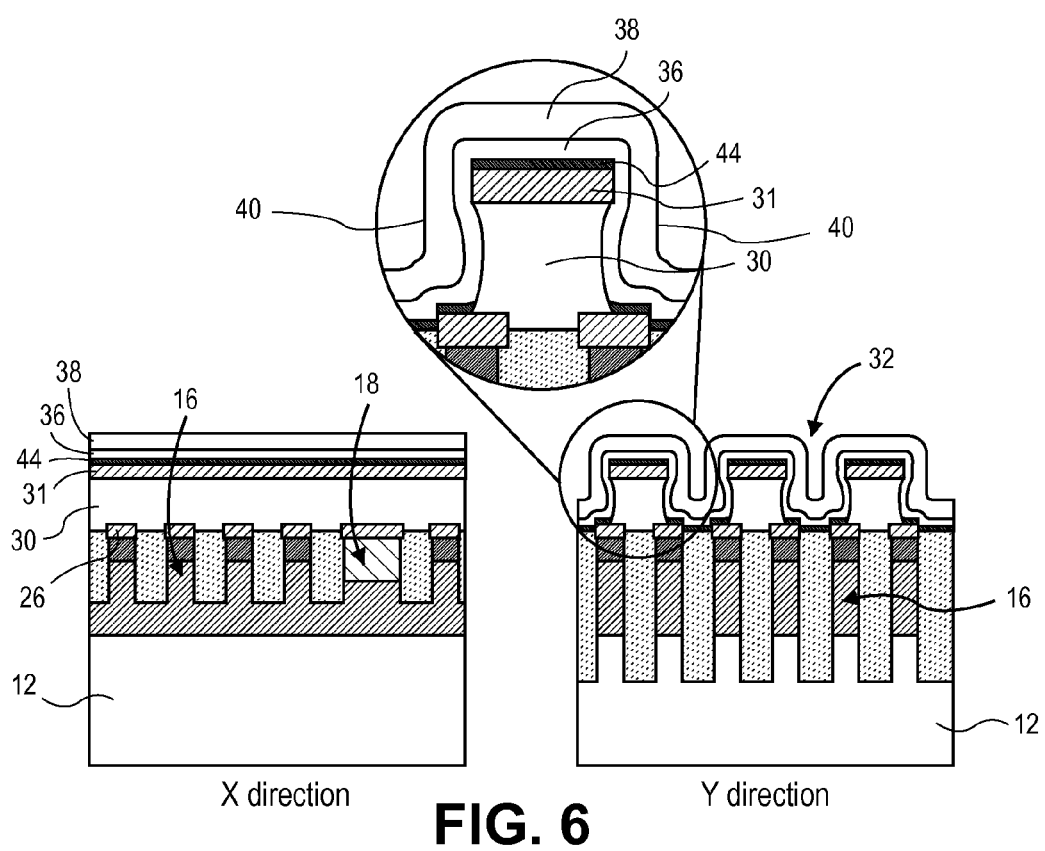
FIG. 6 is a cross-sectional illustration of a conformal dielectric layer deposited over the conformal conductive layer of FIG. 5.

A conformal dielectric layer 38 is then deposited over the conformal conductive layer 36 as illustrated in FIG. 6. In an embodiment, dielectric layer 38 and dielectric layer 30 are formed of the same material to provide uniform removal during a subsequent etching and/or planarization operation. For example, dielectric layer 38 and dielectric layer 30 are formed of a nitride such as silicon nitride in order to protect the conductive layer 36 from oxidation during a subsequent planarization operation or deposition operation in oxidizing conditions. Although embodiments also envision dielectric layers 30 and 38 are not necessarily formed of a nitride and/or are not formed of the same material. When the curved vertical portion of conductive layer 36 formed in the trench 32 is directly above the center vertical axis of an underlying emitter pillar, the thickness of conformal dielectric layer 38 may be approximately half of an underlying emitter pillar 16 width, or also approximately ½ F.

Figure 7:
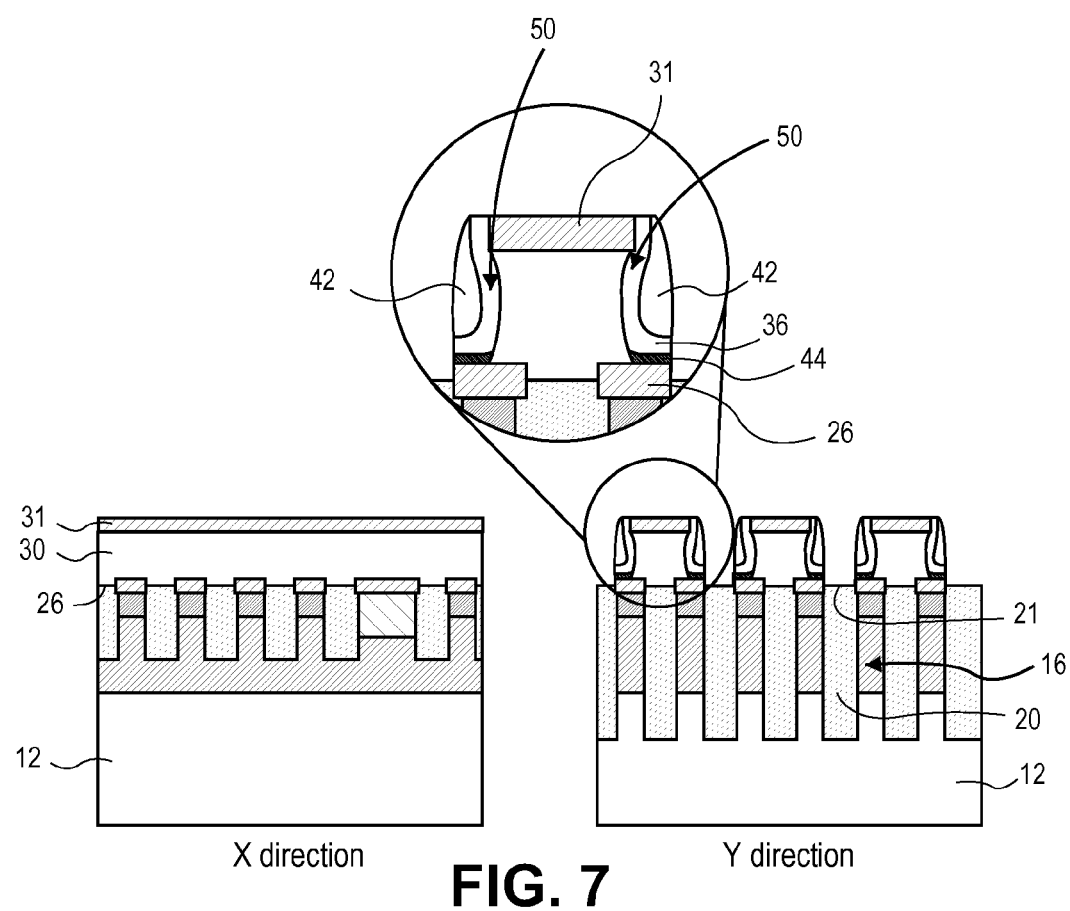
FIG. 7 is a cross-sectional illustration of the conformal dielectric layer, conformal conductive layer, and low resistivity interface layer of FIG. 6 anisotropically etched back.

Conformal dielectric layer 38, conformal conductive layer 36, and low resistivity interface layer 44 are then anisotropically etched back to provide the structure in FIG. 7. As shown, conformal dielectric layer 38, conformal conductive layer 36, and low resistivity interface layer 44 are completely removed from the top surface of dielectric layer 31 and the top surface of the dielectric material 21 filling trenches 20 to form spacers 42 and heater elements 50. In an embodiment, the thickness of the spacers 42 (i.e. vertical portion of dielectric layer 38) is not substantially etched during the anisotripic etching operation and the edges of spacers 42 remain substantially vertically aligned with the sidewalls of the underlying emitter pillars 16 and base pillars 18. By not substantially etched, it is intended that the thickness of the vertical portion of dielectric layer 38 is approximately ½ F. Though, as shown in the expanded portion of FIG. 7, the top portion of dielectric layer 38 (spacers 42) may be somewhat rounded in practice.

Figure 8:
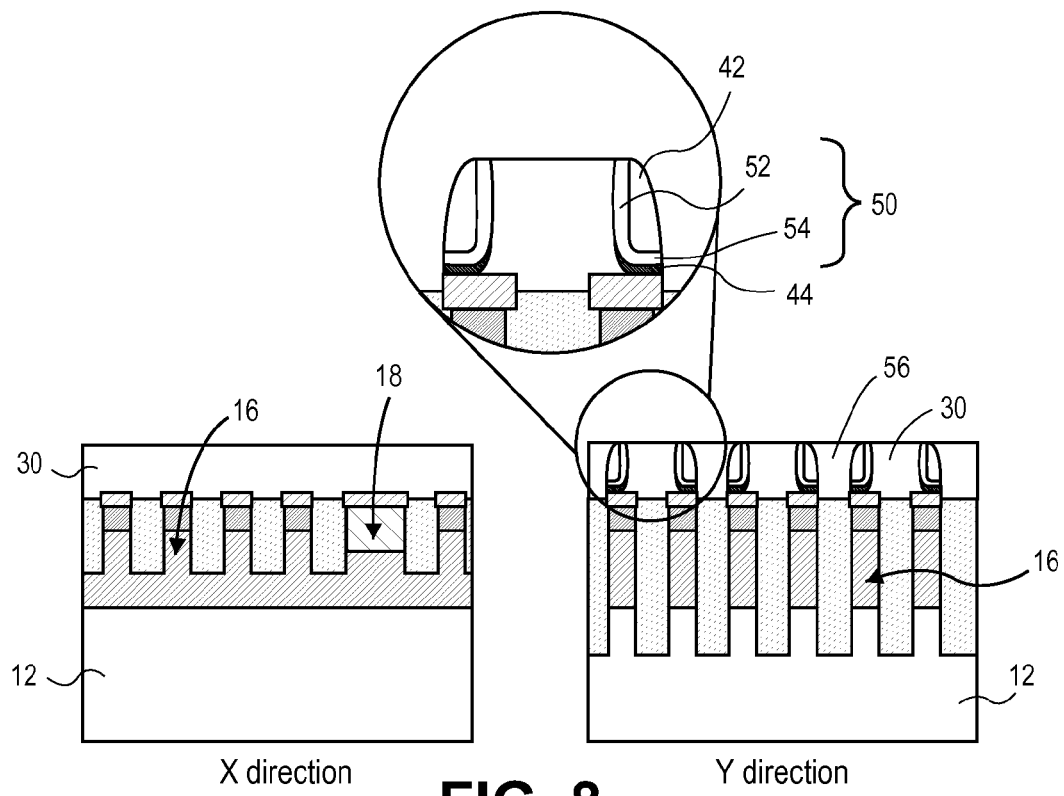
FIG. 8 is a cross-sectional illustration of a dielectric layer deposited over the pnp-BJT array and within the trenches of FIG. 7 and planarized.

A dielectric layer 56 is then blanket deposited over the pnp-BJT array and within the trenches 32 and planarized as shown in FIG. 8. Dielectric layer 56 may be several hundred nm thick to fill the trenches 32. In an embodiment dielectric layer 56 is an oxide, such as silicon oxide. In an embodiment, planarization is performed with chemical mechanical polishing (CMP). As shown, the height of the heater elements 50 and surrounding dielectric materials 30, 42, 56 may be reduced in this operation. Dielectric layer 31 is also removed. In an embodiment, the planarized height of the heater elements 50 is between 50 and 150 nm. In an embodiment, dielectric layer 56 may comprise multiple dielectric layers.

As shown in FIG. 8, adjacent L-shaped heater elements 50 form repeating book-end configurations unique to embodiments of the invention. As shown, a first L-shaped heater element 50 may be facing a first direction, with a spacer 42 on the horizontal portion of the first L-shaped heater element. A second L-shaped heater element adjacent the first L-shaped heater element is facing in a second direction opposite the first direction, with a spacer 42 on the horizontal portion of the second L-shaped heater element. As used herein, the direction the L-shaped heater element is facing is determined by the relationship of the horizontal base 54 and corresponding curved vertical wall 52, with the direction being in the plane of the horizontal base 54 orthogonal to the corresponding curved vertical wall 52. Where the curved vertical walls 52 of the first and second L-shaped heater elements 50 are on opposite sides of a patterned dielectric layer 30, and the first and second horizontal bases 54 are facing opposite directions, the first and second L-shaped heater elements 50 book-end the patterned dielectric layer 30 between the first and second curved vertical walls 52. It is to be appreciated that while the embodiment illustrated in FIG. 8 shows the curved vertical walls 52 directly above the center vertical axes of the underlying emitter pillars 16, the thickness of spacers 42 is approximately ½ F, and the spacers 42 are aligned with the sidewalls of the underlying emitter pillars 16 that such alignment is not required for the self-alignment process in accordance with embodiments of the invention.

Figure 9:
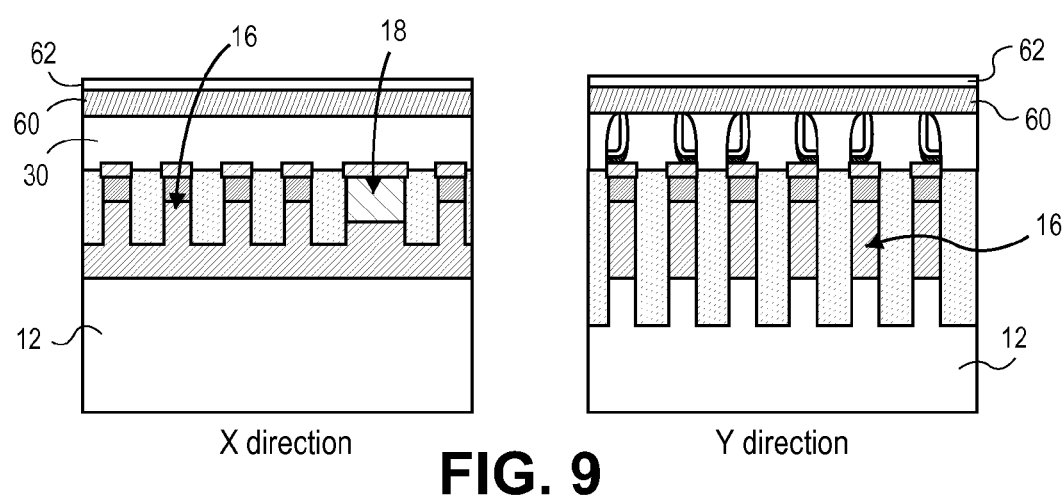
FIG. 9 is a cross-sectional illustration of a phase change layer and metallic cap layer deposited over the structure in FIG. 8.
Figure 10:
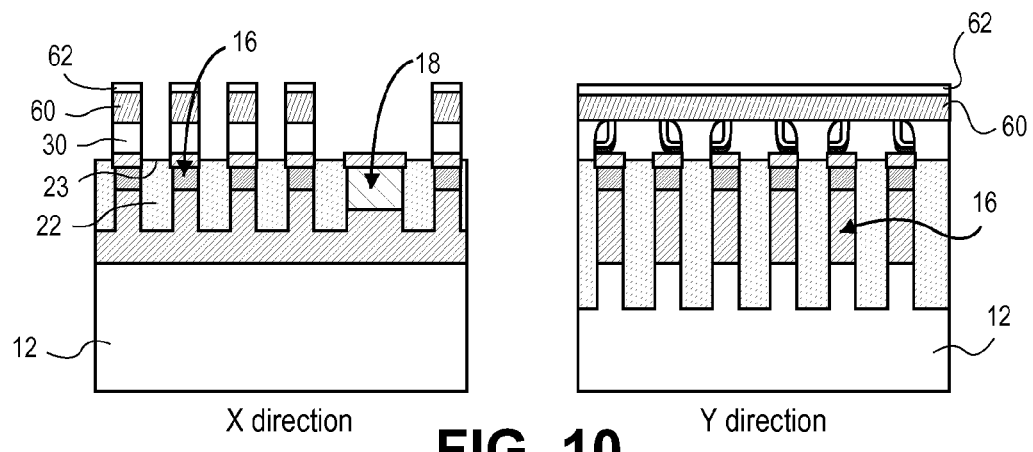
FIG. 10 is an illustration of anisotropically etching lines in the y-direction.

A phase change layer 60, such as a chalcogenide, and metallic cap layer 62 are then blanket deposited over the pnp-BJT array as shown in FIG. 9. In an embodiment, the phase change layer 60 is deposited directly on the heater element 50 thereby avoiding the problem of alignment tolerances that may be found in other configurations in which a phase change material is deposited into a patterned trench. Selection of the phase change material will depend upon the particular device requirements and phases required. In an embodiment, a chalcogenide layer 60 is GST (Ge2Sb2Te5), and the corresponding cap layer 62 is TiN. For example, a GST chalcogenide layer 60 may be deposited by PVD-sputtering and cap layer 62 may be deposited with the same deposition technique. An additional metallic layer can be deposited on top of cap layer 62 in order to reduce the overall electrical resistance. The metallic cap layer 62, phase change layer 60, and dielectric layer 30 are then etched as lines (or trenches) that run parallel to the y-direction and in alignment with the rows of emitter pillars 16, and landing on the top surface of the dielectric material 23 of trenches 22 and silicide 26 of base pillars 18 as illustrated in FIG. 10. While not explicitly shown in FIG. 10, it is clear from the illustration that conductive layer 36 which forms the heater elements 50, low resistivity interface layer 44, dielectric layer 54, and spacers 42 are also etched in FIG. 10. Thus, the etching operation illustrated in FIG. 10 self-aligns the heater element 50 and phase change material 60 for each memory cell in the bitline direction, and separates adjacent heater elements 50 and phase change materials 60 in the wordline direction.

Figure 11:
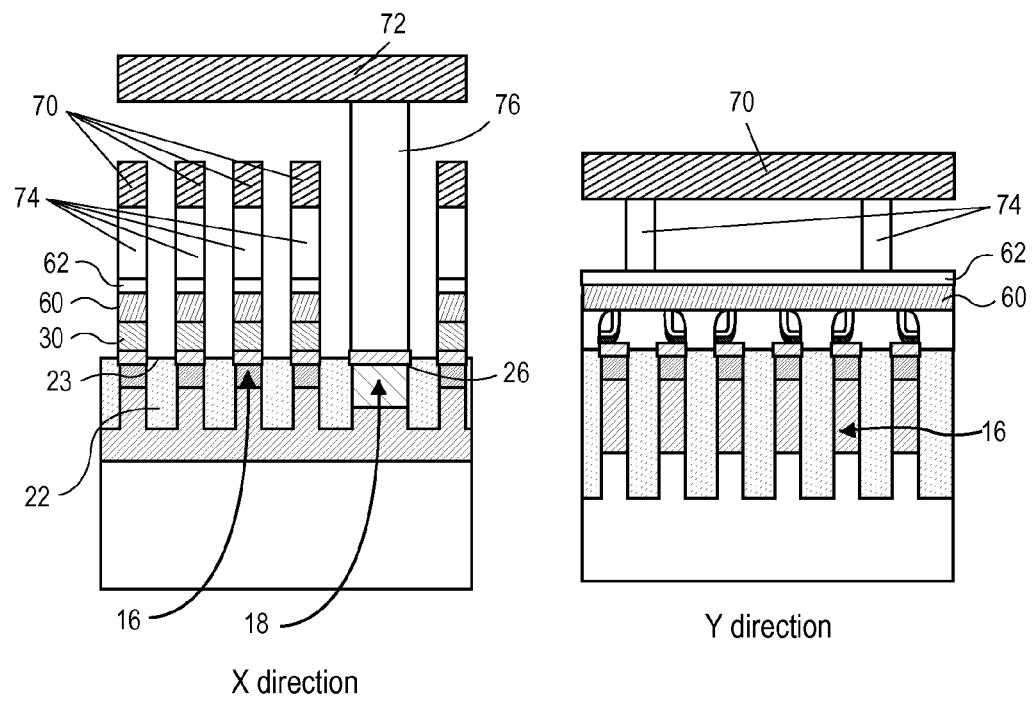
FIG. 11 is an illustration of back end of the line (BEOL) metallization in accordance with an embodiment.

As shown in FIG. 11, a final back end of the line (BEOL) process is then added to form metal bitlines 70 parallel to the y-direction, metal wordlines 72 parallel to the x-direction and all required dielectric and metallization layers. For example, plugs 74 may connect metal bitline 70 to cap layer 62, and plug 76 may connect metal wordline 72 to silicide 26 of base contact 18.

Figure 12:
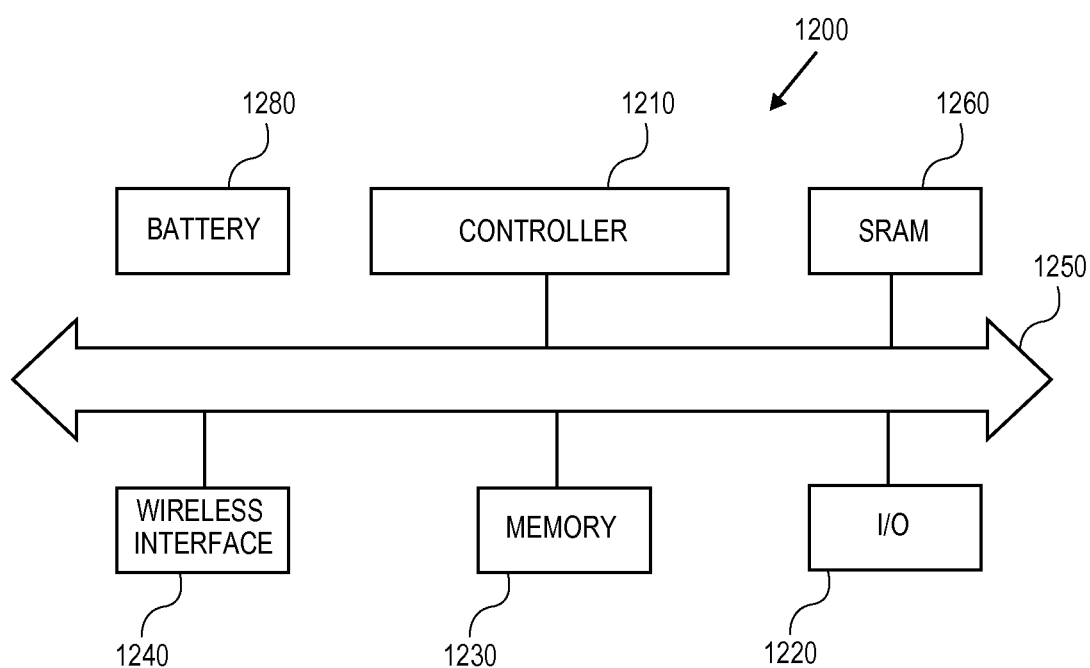
FIG. 12 is an illustration of a system in accordance with an embodiment.

Turning to FIG. 12, a portion of a system 1200 in accordance with an embodiment of the present invention is described. System 1200 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 1200 may be used in any of the following systems: a wireless local area network (WLAN) system, a wireless personal area network (WPAN) system, a cellular network, although the scope of the present invention is not limited in this respect.

System 1200 may include a controller 1210, an input/output (I/O) device 1220 (e.g. a keypad, display), static random access memory (SRAM) 1260, a memory 1230, and a wireless interface 1240 coupled to each other via a bus 1250. A battery 1280 may be used in some embodiments. It should be noted that the scope of the present invention is not limited to embodiments having any or all of these components.

Controller 1210 may comprise, for example, one or more microprocessors, digital signal processors, microcontrollers, or the like. Memory 1230 may be used to store messages transmitted to or by system 1200. Memory 1230 may also optionally be used to store instructions that are executed by controller 1210 during the operation of system 1200, and may be used to store user data. Memory 1230 may be provided by one or more different types of memory. For example, memory 1230 may comprise any type of random access memory, a volatile memory, a non-volatile memory such as a flash memory and/or a memory discussed herein.

I/O device 1220 may be used by a user to generate a message. System 1200 may use wireless interface 1240 to transmit and receive messages to and from a wireless communication network with a radio frequency (RF) signal. Examples of wireless interface 1240 may include an antenna or a wireless transceiver, although the scope of the present invention is not limited in this respect.

In the foregoing specification, various embodiments of the invention have been described. It will, however, be evident that various modifications and changes may be made thereto without departing from the broader spirit and scope of the invention as set forth in the appended claims. The proposed cell architecture can be exploited with several other types of selecting elements such as silicon diode, MOSFET selector, OTS material, ZnO-based diode, binary-oxide diodes placed below the heater element or on top of the chalcogenide layer. Depending on the type of selector chosen, multi-stack array are also feasible. The specification and drawings are, accordingly, to be regarded in an illustrative sense rather than a restrictive sense. It is intended that the appended claims cover all such modifications and variations as fall within the true spirit and scope of this present invention.

What is claimed is:

1. A phase change memory cell comprising:
   a first selection device and a second selection device respectively associated with a first phase change memory cell and a second phase change memory cell, the first and the second selection devices disposed along a wordline direction;
   a contact region on said selection devices;
   an interface layer in direct contact with said contact region;
   an L-shaped vertical heater element in direct contact with said interface layer, wherein said L-shaped vertical heater element includes a curved vertical wall and a horizontal base, wherein the vertical wall and the horizontal base of the L-shaped vertical heater element respectively have a height and a length that perpendicularly extend, and wherein said curved vertical wall of said L-shaped vertical heater element has a width extending perpendicular to a direction of the length of horizontal base and extending along said wordline direction; and
   a phase change material in direct contact with said vertical heater element, wherein the first and the second selection devices are separated along the wordline direction by a trench isolation that extends into and terminates within a wordline under the first and the second selection devices.

2. The phase change memory of claim 1, wherein said contact region is a silicide, and said first selection device is a pnp-BJT.

3. The phase change memory of claim 1, wherein said phase change material comprises a chalcogenide.

4. The phase change memory of claim 1, wherein said vertical heater element comprises a metal nitride.

5. The phase change memory of claim 1, wherein said interface layer is a metallic layer.

6. The phase change memory of claim 5, wherein said metallic layer comprises a metal selected from the group consisting of cobalt, titanium, tantalum, and tungsten.

7. The phase change memory of claim 5, wherein said metallic layer has a thickness of approximately 5 to 10 nm.

8. The phase change memory of claim 1, wherein an uppermost portion of said interface layer comprises a tapered bird-beak extension.

9. The phase change memory of claim 1, further comprising a spacer disposed on said horizontal base.

10. A phase change memory array comprising:
   a plurality of selection devices extending along a wordline direction;
   a silicide contact region on each of said plurality of selection devices;
   an interface material formed on an in direct contact with each of said silicide contact regions;
   a plurality of L-shaped heater elements each comprising a curved vertical wall and a horizontal base, the vertical wall and the horizontal base of the L-shaped vertical heater element respectively having a height and a length that perpendicularly extend, the vertical wall having a width extending perpendicular to a direction of the length of horizontal base and extending along said wordline direction of said phase change memory array, and each L-shaped heater element being in direct contact with said interface material; and
   a phase change material in direct contact with said plurality of L-shaped heater elements;
   wherein said plurality of L-shaped heater elements are self-aligned with said phase change material extending along a bitline direction of said phase change memory array, wherein the plurality of selection devices are separated along the wordline direction by a trench isolation that extends into and terminates within a wordline under the plurality of selection devices.

11. The phase change memory array of claim 10, wherein an uppermost portion of said interface material comprises a tapered bird-beak extension.

12. A phase change memory array comprising:
   a plurality of selection devices arranged in a plurality of rows along a wordline direction and in a plurality of columns along a bitline direction;
   a contact region on each of said plurality of selection devices;
   a plurality of interface materials each formed in direct contact with said contact region;
   a plurality of L-shaped heater elements extending along said wordline direction and in direct contact with said plurality of interface materials, wherein each L-shaped vertical heater element includes a curved vertical wall and a horizontal base, wherein the vertical wall and the horizontal base of the L-shaped vertical heater element respectively have a height and a length that perpendicularly extend, and wherein the curved vertical wall of said L-shaped vertical heater element has a width extending perpendicular to a direction of the length of horizontal base and extending along said wordline direction; and
   a phase change material in direct contact with said plurality of L-shaped heater elements,
   wherein each row of said plurality of rows of selection devices is separated from an adjacent row of said plurality of rows of selection devices by a first trench isolation, and wherein each column of said plurality of columns of selection devices is separated from an adjacent column of said plurality of columns of selection devices by a second trench isolation that extends into and terminates within a wordline under the plurality of selection devices and is shallower than said first isolation.

13. The phase change memory array, wherein said contact region comprises silicide.

\* \* \* \* \*